(12) United States Patent  (10) Patent No.: US 7,733,197 B2
Itou  (45) Date of Patent: Jun. 8, 2010

(54) DUPLEXER AND COMMUNICATIONS EQUIPMENT

(75) Inventor: Motoki Itou, Kyoto (JP)

(73) Assignee: Kyocera Corporation, Kyoto (JP)

( * ) Notice: Subject to any disclaimer, the term of this patent is extended or adjusted under 35 U.S.C. 154(b) by 179 days.

(21) Appl. No.: 12/003,412

(22) Filed: Dec. 26, 2007

(65) Prior Publication Data

US 2008/0150652 A1  Jun. 26, 2008

(30) Foreign Application Priority Data

Dec. 25, 2006  (JP)  ............... 2006-348090

(51) Int. Cl.
*H03H 9/72* (2006.01)
(52) U.S. Cl. ............... 333/133; 333/193
(58) Field of Classification Search ............ 333/133, 333/189, 193, 195; 455/78; 310/313 B, 310/313 D
See application file for complete search history.

(56) References Cited

U.S. PATENT DOCUMENTS

| 6,246,148 | B1 * | 6/2001 | Flowers et al. | 310/313 B |
| 6,380,827 | B1 * | 4/2002 | Noguchi | 333/193 |
| 7,053,731 | B2 * | 5/2006 | Iwamoto et al. | 333/133 |
| 7,339,445 | B2 * | 3/2008 | Aigner et al. | 333/133 |
| 2003/0006859 | A1 * | 1/2003 | Taniguchi | 333/133 |

FOREIGN PATENT DOCUMENTS

| JP | 06-061783 | * | 3/1994 | ............ 333/193 |
| JP | 09-135145 | * | 5/1997 | |
| JP | 09-294048 | * | 11/1997 | |
| JP | 10-093382 | * | 4/1998 | |
| JP | 10-209807 | * | 8/1998 | |
| JP | 2001-230657 | * | 8/2001 | |
| JP | 2002-330054 | | 11/2002 | |
| JP | 2006-157174 | * | 6/2006 | |
| WO | 2004/112246 | | 12/2004 | |

OTHER PUBLICATIONS

Machine Translation of JP 09-294048 published Nov. 11, 1997.*

* cited by examiner

*Primary Examiner*—Barbara Summons
(74) *Attorney, Agent, or Firm*—Bacon & Thomas, PLLC

(57) ABSTRACT

A duplexer includes a piezoelectric substrate, a transmitting filter, and a receiving filter. A transmitting filter includes a ladder filter having a first resonator group which has one or more resonators in one or more series arms and one or more resonators in one or more parallel arms. A receiving filter has a passband higher than that of the transmitting filter, and includes a second resonator group which has one or more resonators in one or more series arms and one or more resonators in one or more parallel arms. A node connects both the transmitting filter and the receiving filter. The receive-side closest resonator closest to the node in the parallel arm is closer to the node than a resonator which is closest to the node in the series arm, and a resonance frequency of the receive-side closest resonator is lower than the passband of the transmitting filter.

20 Claims, 8 Drawing Sheets

DUPLEXER AND COMMUNICATIONS EQUIPMENT

CROSS-REFERENCE TO RELATED APPLICATIONS

The present application claims priority under 35 U.S.C. §119 to Japanese Patent Application No. 2006-348090, filed Dec. 25, 2006, entitled "DUPLEXER AND COMMUNICATIONS EQUIPMENT." The contents of this application are incorporated herein by reference in their entirety.

FIELD OF THE INVENTION

The present invention relates to a communications equipment mainly used for mobile communications; and, more particularly, to a duplexer installed therein.

BACKGROUND OF THE INVENTION

Recently, together with the trend of mobile communications terminals becoming multi-functional and multi-banded, the number of components that constitute a so-called RF (Radio Frequency) front end tends to be increasing. On the other hand, there have been demands for keeping the size and weight of a mobile communications terminal small.

Further, among the components of a mobile communications terminal, filters are frequently used at an RF stage and an IF (Intermediate Frequency) stage. These filters should meet the requirements of low loss, good out-of-band attenuation characteristics and wide bandwidth.

In a mobile communications terminal, a duplexer is a component installed directly under an antenna.

The duplexer is formed by connecting a plurality of filter having different frequency passbands. To meet the demands for reducing the size of devices, the duplexer is recently manufactured by using a surface acoustic wave filter.

Further, a surface acoustic wave duplexer was proposed to improve isolation characteristics while suppressing an insertion loss, in which a resonator at a first stage of a transmitting filter formed of a ladder filter is configured as a parallel resonator, and its capacitance is set to be smaller than half of those of other resonators in parallel arms.

SUMMARY OF THE INVENTION

According to an aspect of the present invention, a duplexer include a piezoelectric substrate, a transmitting filter, a receiving filter and a first inductor. A transmitting filter includes a ladder filter having a first resonator group which has one or more resonators disposed in one or more series arms and one or more resonators disposed in one or more parallel arms. A receiving filter has a passband higher than that of the transmitting filter, and includes a second resonator group which has one or more resonators disposed in one or more series arms and one or more resonators disposed in one or more parallel arms. A node connects both a transmit-side end portion of the transmitting filter and a receive-side first portion of the receiving filter. The receive-side closest resonator which is in the second resonator group and is closest to the node in the parallel arm is closer to the node than a resonator which is in the second resonator group and is closest to the antenna in the series arm, and a resonance frequency of the receive-side closest resonator is lower than the passband of the transmitting filter.

BRIEF DESCRIPTION OF THE DRAWINGS

The above features of the present invention will become apparent from the following description of embodiments given in conjunction with the accompanying drawings, in which.

DETAILED DESCRIPTION OF THE EMBODIMENTS

Figure 1A:
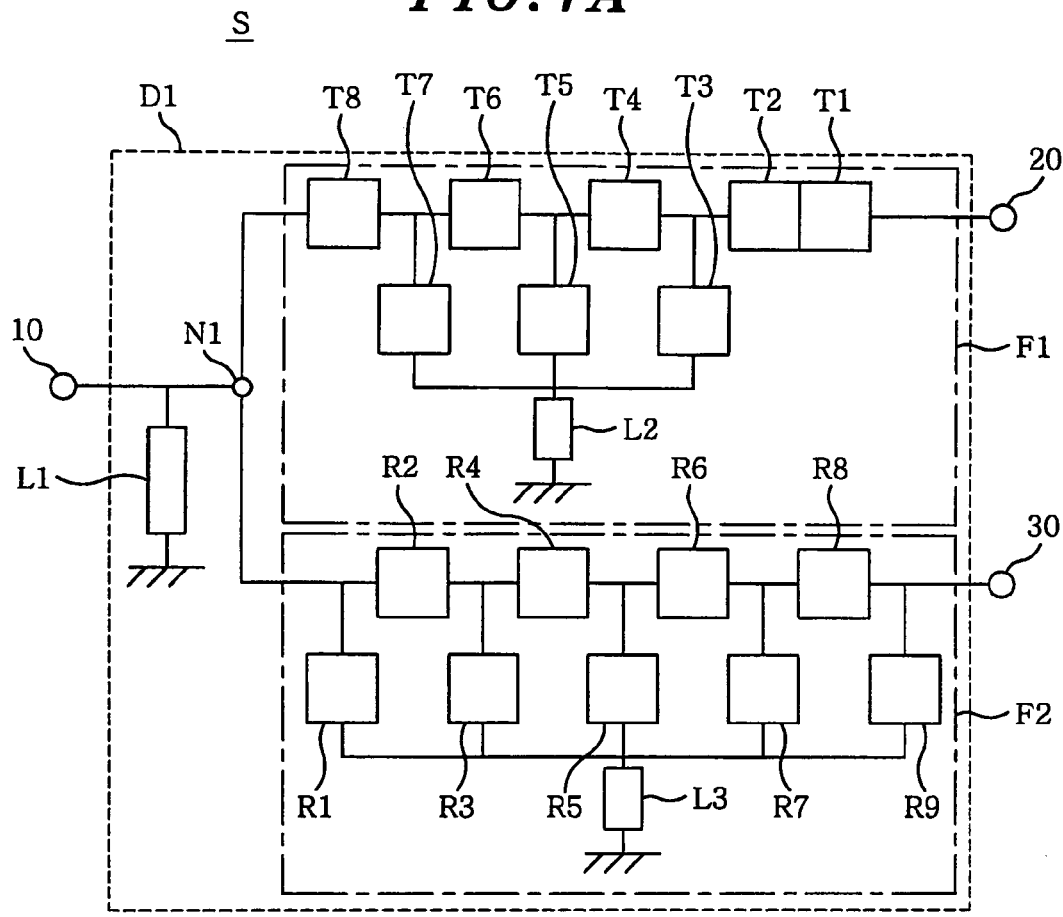
FIGS. 1A and 1B are views for explaining a duplexer D1 in accordance with a first embodiment.

Hereinafter, embodiments of a duplexer in accordance with the present invention will be described with reference to the accompanying drawings. Herein, same parts are designated by same reference characters in the drawings. Further, the size of each electrode (electrode finger), the distance between electrodes, the number of electrodes and, the length and width thereof are chosen for illustrative purpose only, and actual duplexers are not limited thereto.

First Embodiment

Schematic Configuration of Duplexer

Figure 1B:
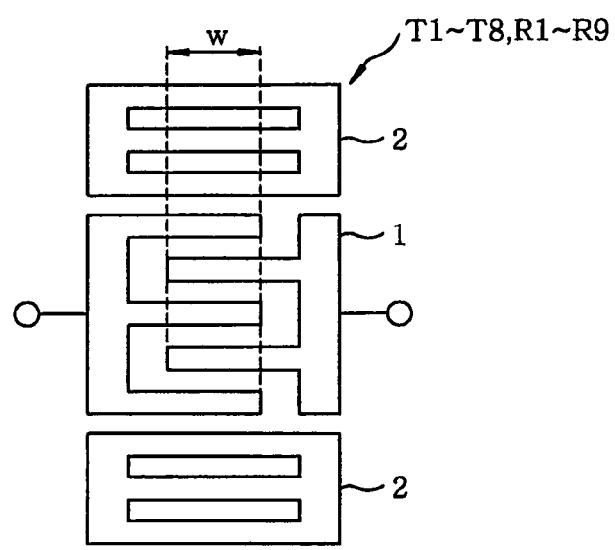

FIGS. 1A and 1B are views for explaining a duplexer D1 in accordance with a first embodiment of the present invention. More specifically, FIG. 1A is a circuit diagram of the duplexer D1, and FIG. 1B is a top schematic view showing a representative configuration of a resonator which forms the duplexer D1. The duplexer D1 is configured such that a transmitting filter F1 connected to a transmission terminal 20 and a receiving filter F2 connected to a receiving terminal 30 are coupled to an antenna terminal 10 via a common signal line. A node N1 connects both a transmit-side end portion of the transmitting filter F1 and a receive-side first portion of the receiving filter F2. The node N1 is further connected to the antenna terminal 10. In FIG. 1A, a dashed line indicates an area of the duplexer D1, and dash-dotted lines indicate areas of the transmitting filter F1 and the receiving filter F2, respectively. However, such lines do not actually exist in the duplexer D1, which is also the case with the other drawings.

In the duplexer D1 as configured above, a signal (i.e., reception signal) received at the antenna terminal 10 is sent to a receiver circuit (not shown) via the receiving filter F2 and the receiving terminal 30. Further, a signal (i.e., transmission signal) inputted from a transmitter circuit (not shown) to the transmission terminal 20 is sent to the antenna terminal 10 via the transmission terminal F1, and then transmitted therefrom.

The transmitting filter F1 includes a plurality of resonators (first resonator group). More particularly, the transmitting filter F1 is a ladder filter (a first ladder filter) formed of a plurality of resonators T1, T2, T4, T6 and T8 connected in series via a signal line interconnecting the antenna terminal 10 and the transmission terminal 20 (that is, the resonators T1, T2, T4, T6 and T8 are arranged in series arms), and a plurality of resonators T3, T5 and T7 connected in parallel with the signal line (that is, the resonators T3, T5 and T7 are arranged in parallel arms). In the same manner, the receiving filter F2 includes a plurality of resonators (second resonator group), and is a ladder filter (a second ladder filter) formed of a plurality of resonators R2, R4, R6 and R8 connected in series in a signal line interconnecting the antenna terminal 10 and the receiving terminal 30 (that is, the resonators R2, R4, R6 and R8 are arranged in series arms), and a plurality of resonators R1, R3, R5, R7 and R9 connected in parallel with the signal line (that is, the resonators R1, R3, R5, R7 and R9 are arranged in parallel arms).

Further, in the present embodiment, the resonators disposed in the series arms are referred to as series resonators, and those disposed in the parallel arms are referred to as parallel resonators. Moreover, the duplexer D1 is configured such that the passband of the receiving filter F2 (i.e., the reception passband) is a higher frequency band than that of the transmitting filter F1 (i.e., the transmission passband). Further, the transmission passband is set to include a transmission frequency band (i.e., a frequency band of the transmission signal that is to be sent from the transmitter circuit to the antenna), and the reception passband is set to include a receiving frequency band (i.e., a frequency band of the reception signal to be sent from the antenna to the receiver circuit).

The duplexer D1 is formed on a specific piezoelectric substrate S. The resonators T1 to T8 and R1 to R9 in the duplexer D1 are surface acoustic wave resonators, each of which includes an IDT (Inter Digital Transducer) 1 and reflectors 2 as shown in FIG. 1B. The IDT 1 has a pair of comb-shaped electrodes at which a plurality of electrode fingers are formed such that the lengthwise direction thereof is perpendicular to the propagation direction of the surface acoustic wave in the piezoelectric substrate S. The reflectors 2 are formed at both ends of the IDT 1, and each of the reflectors 2 has a lattice-shaped electrode at which a plurality of electrode fingers are formed such that the lengthwise direction thereof is perpendicular to the propagation direction of the surface acoustic wave in the piezoelectric substrate S.

Detailed descriptions about the fabrication of the duplexer D1 will be given later. Further, the number and arrangement of the resonators in the transmitting filter F1 and the receiving filter F2, the number of the electrode pairs in the IDT in each resonator, the crossing width and the number of the reflectors can be properly selected in consideration of the design. That is, the resonators do not necessarily have the same number of the pairs, the same crossing width and the same resonance frequency.

In addition, an inductor (first inductor) L1 for impedance matching, via which a signal line coupled to the antenna is connected to the ground, is disposed between the antenna terminal 10 and the filters F1 and F2. That is, the duplexer D1 is configured such that the impedance between the antenna terminal 10 and the transmitter circuit connected to the transmission terminal 20 is substantially infinite in the reception passband, whereas the impedance between the transmitter circuit and the receiver circuit connected to the receiving terminal 30 is substantially infinite in the transmission passband.

Further, in order to improve attenuation characteristics in the reception passband, the transmitting filter F1 further includes an inductor (second inductor) L2 via which the parallel resonators T3, T5 and T7 are connected to the ground. Likewise, in order to improve attenuation characteristics in the transmission passband, the receiving filter F2 further includes an inductor L3 via which the parallel resonators R1, R3, R5, R7 and R9 are connected to the ground.

(Attenuation Characteristics of Transmission Signal in the Lower Vicinity of the Passband)

The duplexer D1 with the above-stated schematic configuration in accordance with the present embodiment has a feature in that the parallel resonator R1, whose resonance frequency is lower than the transmission passband, is the resonator located closest to the antenna (i.e., located closet to the antenna terminal 10) among the resonators in the receiving filter F2. Hereinafter, the parallel resonator R1 will be referred to as the closest resonator R1.

If, for example, the duplexer D1 is configured to have a transmission passband including a frequency range from 824 MHz to 849 MHz (which is a transmission frequency band) and a reception passband including a frequency range from 869 MHz to 894 MHz (which is a receiving frequency band), it is preferable for the closest resonator R1 to be configured such that the resonance frequency thereof is about 810 MHz.

In the transmission signal inputted at the transmission terminal 20 and then relayed to the transmitting filter F1, signal components whose frequency is close to the resonance frequency of the closest resonator R1 in the duplexer D1 tend to flow to the ground via the closest resonator R1, which is caused by the presence of the closest resonator R1 in the duplexer D1. Therefore, it is possible to improve the attenuation characteristics of the duplexer D1 at frequencies in the lower vicinity of the transmission passband. That is, a deterioration in attenuation characteristics of the transmission signal in the lower vicinity of the transmission passband, which might otherwise occur due to the presence of the inductor L2 as described above, can be suppressed by further providing the closest resonator R1.

From a different point of view, it can also be stated that attenuation characteristics of the transmission signal is improved by changing the configuration of the receiving filter F2 without a change to the transmitting filter F1.

It is preferable that the closest resonator R1 is configured such that the number of the electrode pairs in the IDT therein multiplied by a crossing width w (which is defined as a width of a crossing portion where a pair of comb-shaped electrodes cross each other) shown in FIG. 1B is smaller than the number of the electrode pairs in the IDT in each of the other parallel resonators R3, R5, R7 and R9 in the receiving filter F2 multiplied by the crossing width thereof. If, for example, the number of the electrode pairs in each of the parallel resonators R3, R5, R7 and R9 is within a range from 80 to 120 and the crossing width thereof is within a range from 60 μm to 140 μm, it is appropriate that the number of the electrode pairs in the closest resonator R1 is set to be 80 and the crossing width thereof is set to be 12 μm. Here, the number of the electrode pairs in the parallel resonators R3, R5, R7 and R9 multiplied by the crossing width thereof is within a range from 4800 to 16800 pairs·μm, and the number of the electrode pairs in the closest resonator R1 multiplied by the crossing width thereof is 960 pairs·μm, thereby satisfying the above-mentioned condition.

In this case, a capacitive component of the closest resonator R1 is smaller than those of the other parallel resonators R3, R5, R7 and R9, and an impedance of the receiving filter F2 increases in a frequency range other than the resonance frequency of the closest resonator R1. Therefore, in the signal inputted at the transmission terminal 20 and relayed to the transmitting filter F1, signal components within the frequency range other than the resonance frequency of the closest resonator R1 become less likely to flow to the ground via the closest resonator R1. That is, by providing the closest resonator R1, an increase in the loss is nearly neglected in the transmission passband.

Further, although the parallel resonators used for the transmitting filter F1 in FIG. 1 are three in number, the above-described effect can be achieved by providing only a single number of the closest resonator R1 without depending on the total number of parallel resonators. Therefore, compared to the conventional case of installing a plurality of inductors corresponding to the parallel resonators for acquiring the attenuation characteristics, an increase in size of the duplexer is suppressed in the present embodiment.

Thus, in accordance with the present embodiment, it is possible to provide a duplexer having high attenuation characteristics in a frequency range other than the passband (especially in a frequency range lower than the passband including the transmission frequency band) while meeting the demands for reducing the device size.

(Duplexer Manufacturing Method)

Hereinafter, the material of each part of the duplexer D1 in the present embodiment and a manufacturing method thereof will be described.

The duplexer D1 in the present embodiment can be manufactured by forming the resonators that constitute the transmitting filter F1 and the receiving filter F2 on the piezoelectric substrate S by using the surface acoustic wave resonator shown in FIG. 1B.

It is preferable that a 36°±10° Y-cut X-propagation LiTaO$_3$ single crystal, a 64°±10° Y-cut X-propagation LiNbO$_3$ single crystal, a 45°±10° X-cut Z-propagation Li$_2$B$_4$O$_7$ single crystal or the like is used for the piezoelectric substrate S. This is because their electromechanical coupling coefficients are high, and their temperature coefficients of group delay time are low. In particular, the 36°±10° Y-cut X-propagation LiTaO$_3$ single crystal, which has a high electromechanical coupling coefficient, is especially preferable. Further, it is preferable that the cut angle is within a range of 36°±10° in the Y direction of the crystal. In this manner, satisfactory piezoelectric characteristics can be obtained.

The thickness of the piezoelectric substrate S is preferably within a range from 0.1 to 0.5 mm. If the thickness is less than 0.1 mm, the piezoelectric substrate becomes weak; if the thickness exceeds 0.5 mm, the material costs increase. Besides, a reduction-treated piezoelectric substrate S may be used for reducing a damage in the electrodes that might be caused by the pyroelectric effect. Further, a piezoelectric substrate S to which iron (Fe) is added may also be used in order to reduce the damage in the electrode due to the pyroelectric effect.

Each of the IDTs 1 in the series and parallel resonators that constitute the transmitting filter F1 and the receiving filter F2 is formed such that a pair of the comb-shaped electrodes are engaged with each other. The comb-shaped electrodes are provided with a plurality of electrode fingers formed such that the lengthwise direction thereof is perpendicular to the propagation direction of the surface acoustic wave in the piezoelectric substrate S. The electrode fingers may be made of Al or Al alloy based on Al—Cu, Al—Ti, Al—Mg, Al—Cu—Mg or the like. Moreover, the electrode fingers may also be made of laminated films of Al—Cu/Cu/Al—Cu, Ti/Al—Cu, Ti/Al—Cu/Ti or the like. Further, the reflector 2 in each resonator is made of the same material as that of the electrode fingers.

Further, the resonators are fabricated by forming a metal film of the above material by a thin film forming method such as electron-beam deposition, sputtering or CVD; and then performing an etching process according to a known method such as photolithography, RIE or the like to form specified patterns. It is preferable that the IDT 1 and the reflectors 2 in each resonator have the above-mentioned number of the electrode pairs and the above-mentioned crossing width; and the line width, the pitch and the thickness of each electrode finger is within a range from 0.1 to 10 μm, 0.1 to 10 μm and 0.1 to 0.5 μm, respectively.

Although the inductors L1, L2 and L3 may be formed on the piezoelectric substrate S together with the resonators, this is not an essential requisite. In other words, the inductors L1, L2 and L3 are not necessarily to be formed on the piezoelectric substrate S. For example, they may be formed directly on a substrate where the duplexer D1 (more exactly, the remaining parts of the duplexer D1 except for those inductors) is installed. Further, it is also possible to form the inductors by a process in which chip inductances are prepared independently from the duplexer D1 (more exactly, the remaining parts of the duplexer D1 except for the inductors L1, L2 and L3), and are installed on different substrates. Moreover, the width and the line length of each electrode in the inductors, as well as the type and the thickness of the conductive material that forms each of the inductors can be properly adjusted depending on a desired inductance value.

(Application to the Communications Equipment)

As described above, the duplexer D1 in the present embodiment has a small size and better attenuation characteristics. Further, the duplexer D1 in the present embodiment can be applied to the communications equipment.

Figure 4:
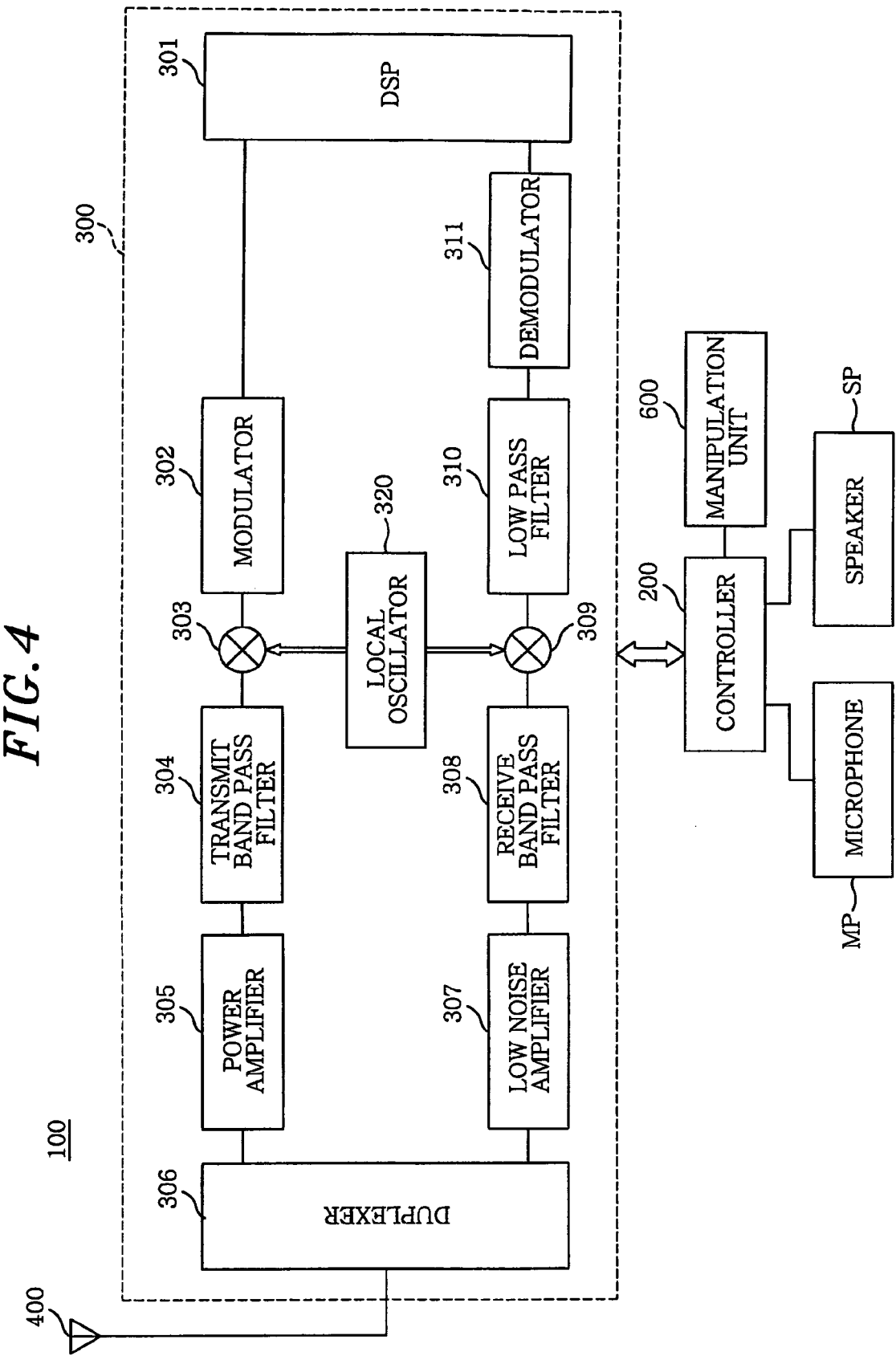
FIG. 4 schematically shows a configuration of a communications equipment 100.
Figure 5:
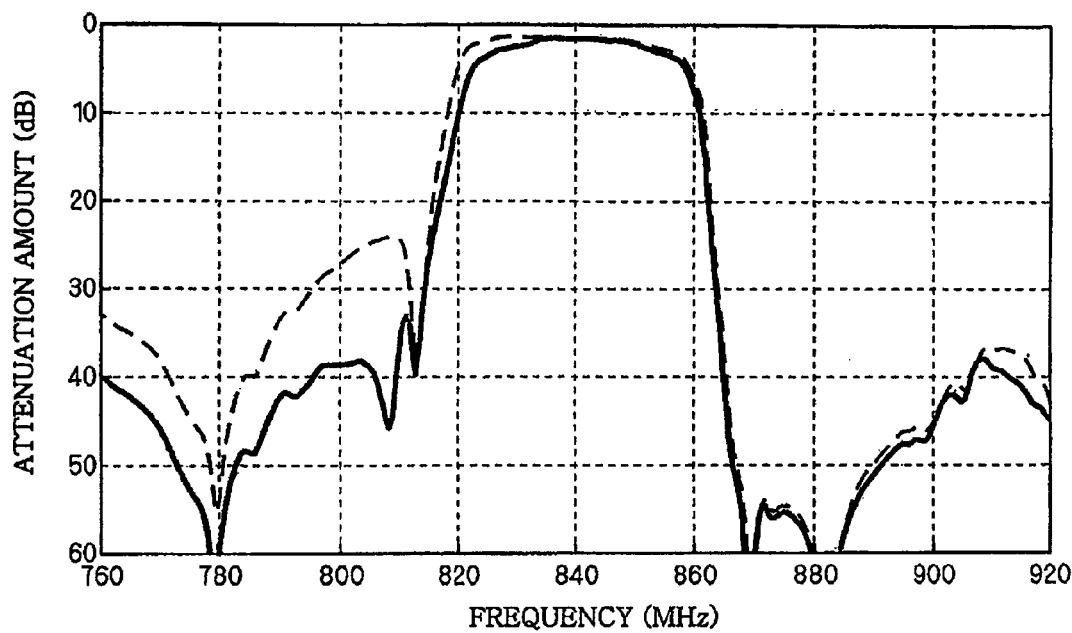
FIG. 5 shows attenuation characteristics in the vicinity of a transmission passband of duplexers in accordance with an implementation example 1 and a comparative example 1.
Figure 6:
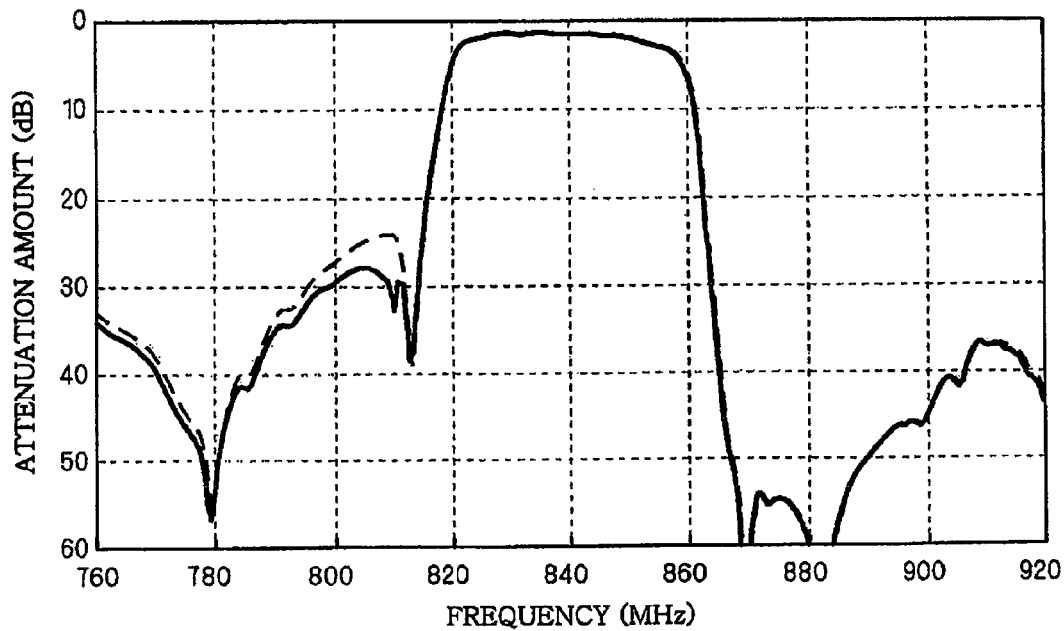
FIG. 6 shows attenuation characteristics in the vicinity of a transmission passband of duplexers in accordance with an implementation example 2 and the comparative example 1.
Figure 7:
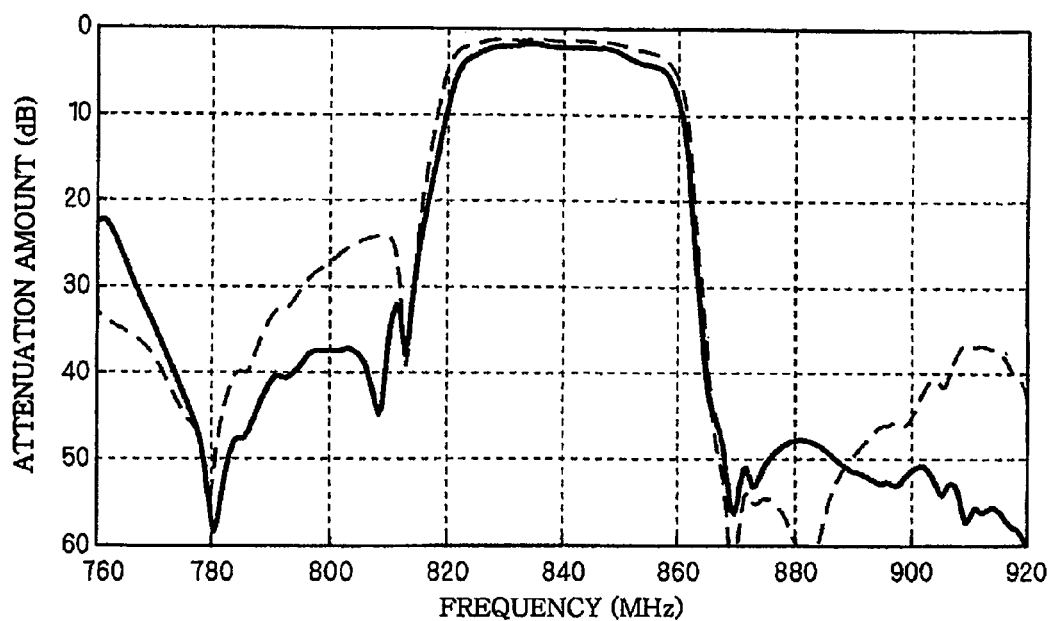
FIG. 7 shows attenuation characteristics in the vicinity of a transmission passband of duplexers in accordance with an implementation example 3 and the comparative example 1.
Figure 8:
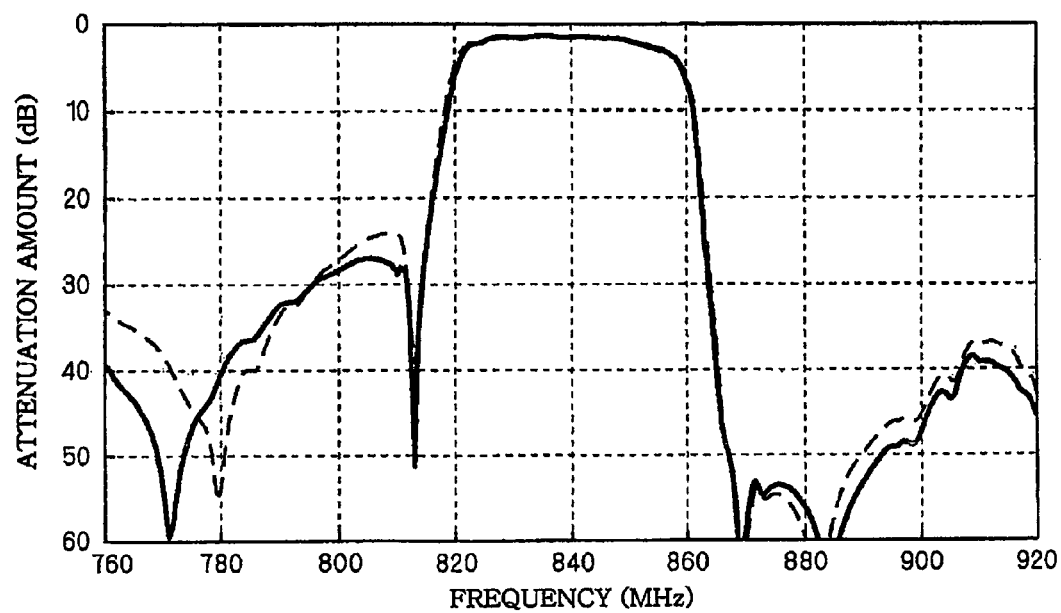
FIG. 8 shows attenuation characteristics in the vicinity of a transmission passband of duplexers in accordance with an implementation example 4 and the comparative example 1.

FIG. 4 schematically shows a configuration of a communications equipment 100 as an example of its kind. The communications equipment 100 mainly includes a transmission and reception unit 300, an antenna 400, a controller 200, a manipulation unit 600, a microphone MP and a speaker SP.

The controller 200 controls various operations of the communications equipment 100 on the overall basis. The controller 200, provided with a CPU, RAM, ROM and the like, reads out and runs programs stored in the ROM to perform various controls and functions of the communications equipment 100.

In the transmission and reception unit 300, an analog voice signal inputted thereto from the microphone MP via the controller 200 is A/D converted (i.e. converted from an analog signal to a digital signal) by a DSP (Digital Signal Processor) 301, modulated by a modulator 302, and then frequency-converted by a mixer 303 using an oscillation signal created by a local oscillator 320. The output of the mixer 303 passes through a transmitting band pass filter 304, a power amplifier 305 and a duplexer 306, and then is transmitted from the antenna 400 as a transmission signal.

Further, a reception signal is fed to a mixer 309 from the antenna 400 via the duplexer 306, a low noise amplifier 307 and a receiving band pass filter 308. The mixer 309 frequency-converts the reception signal using the oscillation signal created by the local oscillator 320, and the frequency-converted signal passes through a low pass filter 310 to be demodulated by a demodulator 311. Further, after D/A converted (i.e., converted from a digital signal into an analog signal) by the DSP 301, the signal is outputted from the speaker SP via the controller 200 as an analog voice signal.

The manipulation unit 600 receives various inputs to the communications equipment 100 from the user, and includes, for example, various buttons.

The duplexer D1 of the present embodiment can be used as the duplexer 306 in the communications equipment 100. Thus, without using a large-sized duplexer, the communications equipment capable of suppressing a signal leakage between the transmitter circuit and the receiver circuit can be implemented. In short, it is possible to provide a compact communications equipment with a high communications quality.

Second Embodiment

Figure 2:
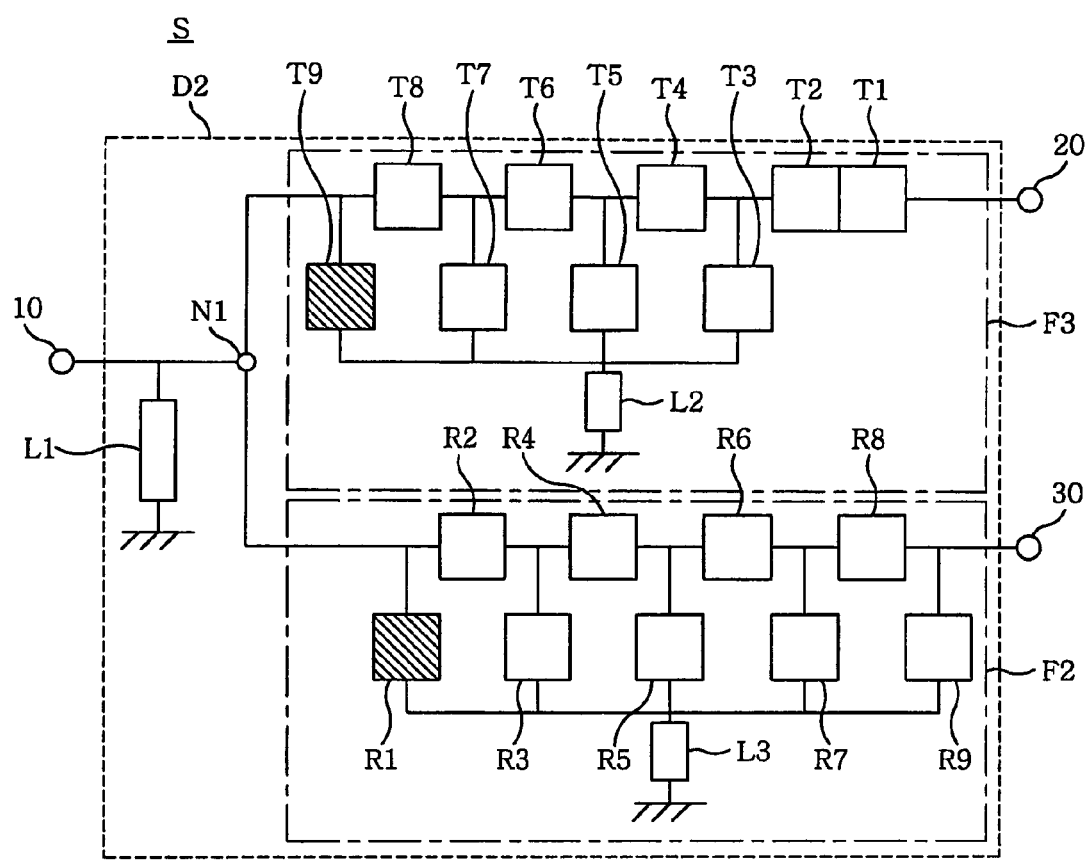
FIG. 2 is a circuit diagram of a duplexer D2 in accordance with a second embodiment.

FIG. 2 is a circuit diagram of a duplexer D2 in accordance with a second embodiment of the present invention. The duplexer D2 is configured such that a transmitting filter F3 connected to a transmission terminal 20 and a receiving filter F2 connected to a receiving terminal 30 are coupled to an antenna terminal 10 via a common signal line.

The signal transmission and reception of the duplexer D2 are performed in the same manner as those of the duplexer D1 in the first embodiment. That is, a signal (reception signal) received by the antenna terminal 10 is sent to a receiver circuit (not shown) via the receiving filter F2 and the receiving terminal 30. Further, a signal (transmission signal) inputted to the transmission terminal 20 from a transmitter circuit (not shown) is sent to the antenna terminal 10 via the transmission terminal F3.

Further, also in the present embodiment, the duplexer D2 is configured such that the passband of the receiving filter F2 (reception passband) is a frequency range higher than that of the transmitting filter F3 (transmission passband).

The duplexer D2 has the same configuration as that of the duplexer D1 in the first embodiment except for the transmitting filter F3. To be specific, the duplexer D2 is configured such that the resonator located closest to the antenna among the resonators in the transmitting filter F3 is a parallel resonator T9 (hereinafter, referred to as the closest resonator T9) whose resonance frequency is lower than the transmission passband. This is a feature different from the duplexer D1 that does not include the closest resonator T9 (in the transmitting filter F1 of the duplexer D1, the series resonator T8 is the resonator closest to the antenna).

With this configuration of the duplexer D2, in the transmission signal inputted from the transmission terminal 20, signal components whose frequency is close to the resonance frequency of the closest resonator T9 tend to flow to the ground via the closest resonator T9. Further, since the receiving filter F2 has the closest resonator R1 in the same manner as the duplexer D1 in the first embodiment, the same effect of the closest resonator R1 as described in the first embodiment is also achieved by the duplexer D2. Further, since the duplexer D2 has the effect of the closest resonator T9 in addition to that of the closest resonator R1, frequency characteristics are further improved.

For example, by configuring the closest resonators R1 and T9 to have different resonance frequencies while satisfying the above-described conditions, a plurality of attenuation poles are obtained to thereby achieve good attenuation characteristics. If the duplexer D2 has a transmission passband including a frequency range from 824 MHz to 849 MHz and a reception passband including a frequency range from 869 MHz to 894 MHz, the closest resonators R1 and T9 may be configured to have the resonance frequencies of about 810 MHz and about 750 MHz, respectively. Thus, the attenuation characteristics at frequencies in the lower vicinity of the transmission passband can be improved further than the duplexer D1 in the first embodiment while suppressing the insertion loss to be as small as that of the duplexer D1.

Further, it is also possible that both of the closest resonators R1 and T9 have the resonance frequency of about 810 MHz. In this case, the attenuation characteristics of the duplexer D2 in the higher vicinity of the transmission passband are improved compared to the duplexer D1 that includes the closest resonator R1 but not the closest resonator T9.

Further, it is preferable that the number of the electrode pairs in the IDT 1 in the closest resonator T9 multiplied by the crossing width thereof is set to be smaller than the number of the electrode pairs in the IDT in each of the other parallel resonators T3, T5 and T7 in the transmitting filter F3 multiplied by the crossing width thereof. If, for example, the number of the electrode pairs in each of the parallel resonators T3, T5 and T7 is set to be about 80 and the crossing width thereof is set within a range from 50 μm to 130 μm, it is appropriate that the number of the electrode pairs of the closest resonator T9 is set to be 80 and the crossing width thereof is set to be 12 μm. Here, the number of the electrode pairs in each of the parallel resonators T3, T5 and T7 multiplied by the crossing width thereof is within a range from 4000 to 10400 pairs·μm, whereas the number of the electrode pairs in the closest resonator T9 multiplied by the crossing width thereof is 960 pairs·μm, thereby meeting the above-mentioned condition.

In this case, the capacitive component of the closest resonator T9 is smaller than those of the other parallel resonators T3, T5 and T7, and the impedance of the receiving filter F2 increases in a frequency range other than the resonance frequency of the closest resonator T9. Thus, in the signals transmitted from the transmission terminal 20 and relayed to the transmitting filter F3, signal components within a frequency range other than the resonance frequency of the closest resonator R1 become less likely to flow to the ground via the closest resonator T9. That is, by further providing the closest resonator T9, an increase in the loss is almost prevented in the transmission passband.

The duplexer D2 in the present embodiment can be fabricated using the same method as that of the duplexer D1 in the first embodiment. Further, it can also be applied to the communications equipment in the same manner as in the first embodiment.

As described above, in accordance with the present embodiment, it is possible to provide the duplexer D2 capable of suppressing a deterioration in attenuation characteristics of the transmission signal in the lower vicinity of the transmission passband that might otherwise occur due to the presence of the inductor L2 as described above.

Third Embodiment

Figure 3A:
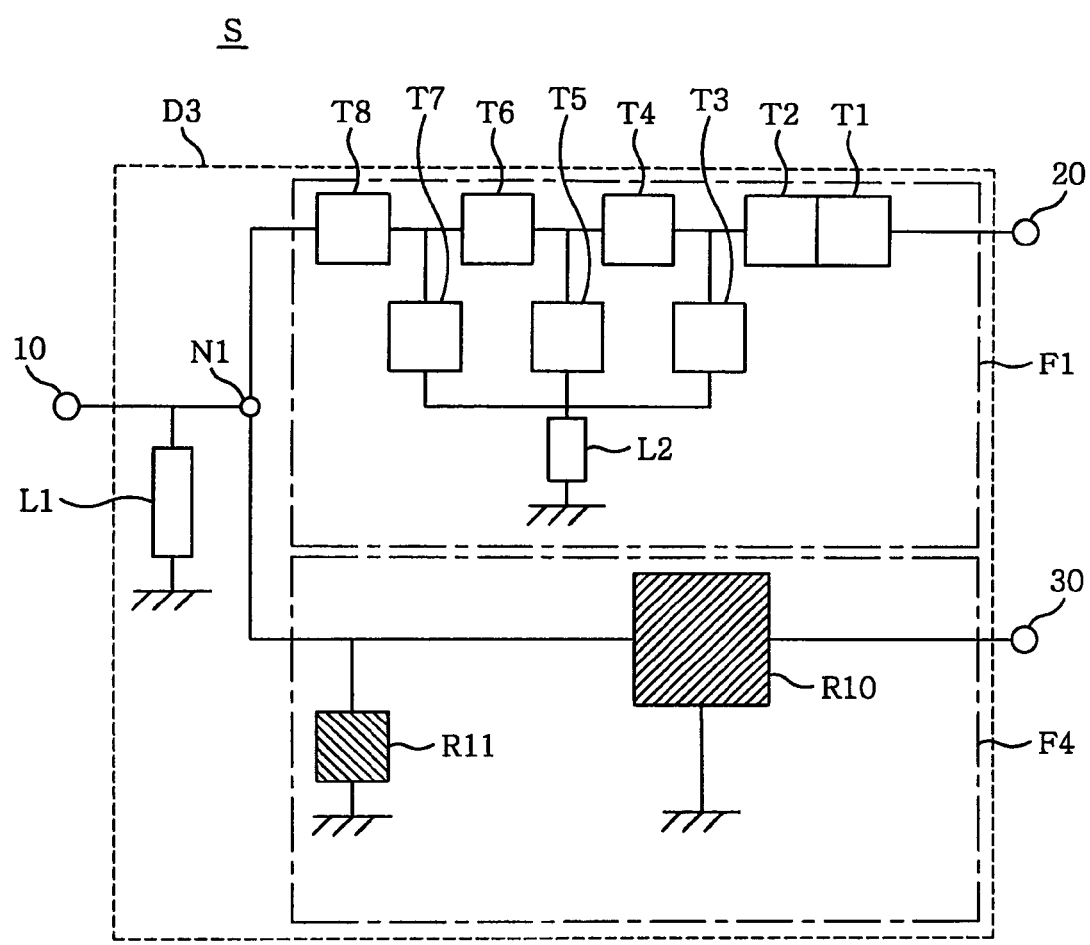
FIGS. 3A and 3B are views for explaining a duplexer D3 in accordance with a third embodiment.
Figure 3B:
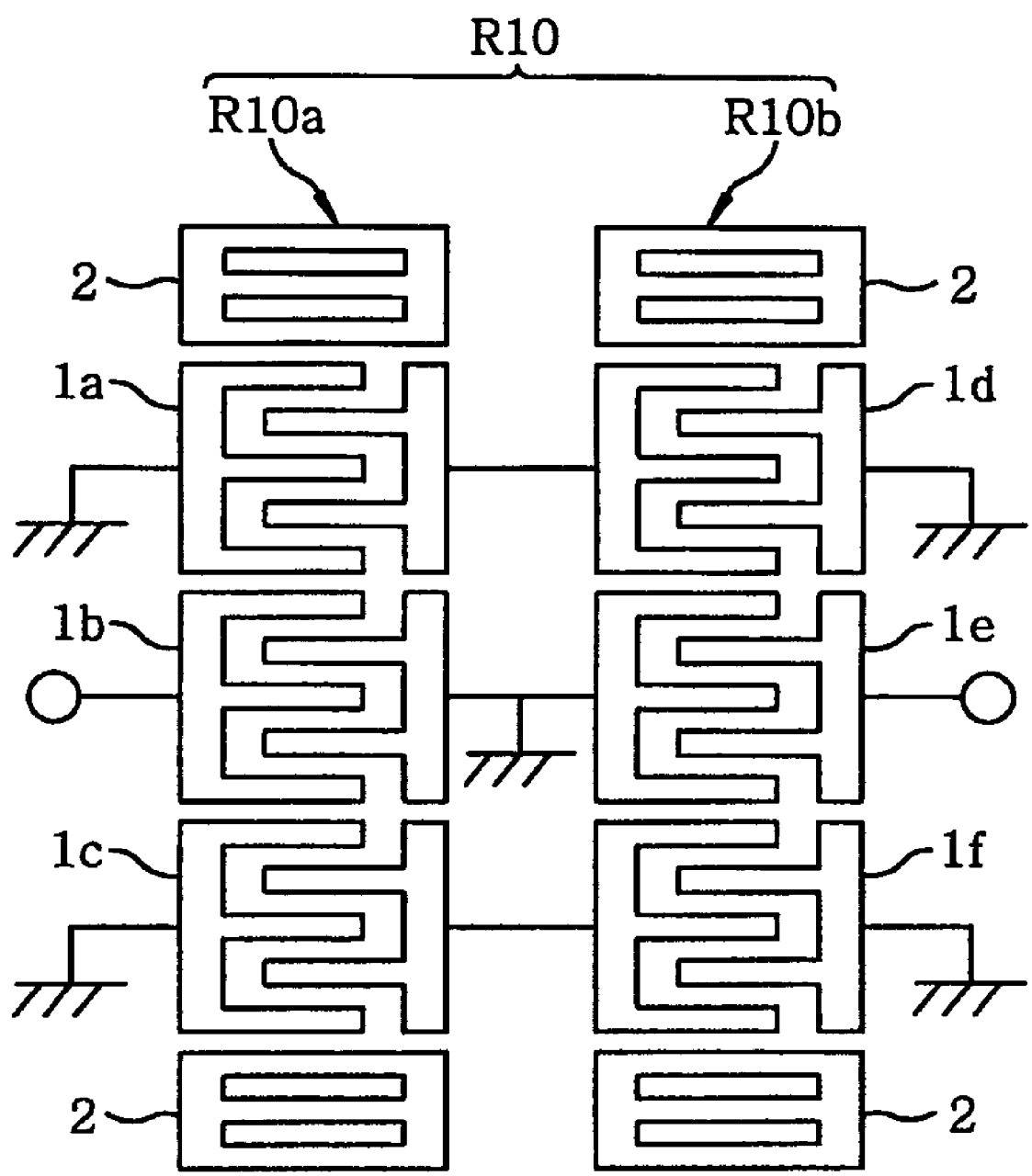

In the first and second embodiments, the transmitting filter and the receiving filter are formed of ladder filters. However, the configuration of the duplexer in accordance with the present invention is not limited thereto. FIGS. 3A and 3B are views for explaining a duplexer D3 in accordance with the third embodiment of the present invention. In specific, FIG. 3A is a circuit diagram of the duplexer D3, and FIG. 3B is a top schematic view showing a representative configuration of a DMS (Double Mode SAW) filter R10 included in the duplexer D3. The duplexer D3 is configured such that a transmitting filter F1 connected to a transmission terminal 20 and a receiving filter F4 connected to a receiving terminal 30 are coupled to an antenna terminal 10 via a common signal line.

The transmission and reception of signals in the duplexer D3 are performed in the same manner as those of the duplexer D1 in the first embodiment. That is, a signal (reception signal) received by the antenna terminal 10 is sent to a receiver circuit (not shown) via the receiving filter F4 and the receiving terminal 30. Further, a signal (transmission signal) inputted to the transmission terminal 20 from a transmitter circuit (not shown) is sent to the antenna terminal 10 via the transmission terminal F1.

Furthermore, in the present embodiment as well, the duplexer D3 is configured such that the passband of the receiving filter F4 (reception passband) is a higher frequency range than that of the transmitting filter F1 (transmission passband).

The configuration of the receiving filter F4 in the duplexer D3 differs from the receiving filter F2 in the duplexer D1 in that the receiving filter F4 in the duplexer D3 is not a ladder filter, and includes a DMS filter R10 disposed in a series arm and a parallel resonator R11 disposed in a parallel arm.

As shown in FIG. 3B, the DMS filter R10 is a multimode filter. The DMS filter R10 has filters R10a and R10b connected to each other in two stages. The filter R10a includes three IDTs 1a, 1b and 1c arranged adjacent to one another, and two reflectors 2 disposed at both ends of an IDT array formed of the three IDTS 1a, 1b and 1c. However, the series resonator R10 is not limited to one with the two-stage configuration as above.

Each of the IDTs 1a, 1b and 1c includes a mutually facing pair of comb-shaped electrodes formed such that the lengthwise direction thereof is perpendicular to the propagation direction of the surface acoustic wave in the piezoelectric substrate S. Further, each of the reflectors 2 has lattice-shaped electrodes formed such that the lengthwise direction thereof is perpendicular to the propagation direction of the surface acoustic wave in the piezoelectric substrate S. Likewise, the filter R10b includes three IDTS 1d, 1e and 1f arranged adjacent one another, and two reflectors 2 disposed at both ends of an IDT array formed of the three IDTs 1d, 1e and 1f. Each of the IDTs 1d, 1e and 1f includes a mutually facing pair of comb-shaped electrodes formed such that the lengthwise direction thereof is perpendicular to the propagation direction of the surface acoustic wave in the piezoelectric substrate S. Further, each of the reflectors 2 has lattice-shaped electrodes formed such that the lengthwise direction thereof is perpendicular to the propagation direction of the surface acoustic wave in the piezoelectric substrate S.

However, the filter in each stage of the DMS filter R10 does not necessarily have three IDTS, and will be adequate as long as it has at least two IDTs.

With the above configuration in which a multimode filter is used as the DMS filter R10 in the transmitting filter F4, a sharpness in attenuation characteristics at a frequency range lower than the reception passband can be enhanced with respect to the reception signal inputted thereto. Further, in the DMS filter R10, the number of the electrode pairs, the crossing width, the number of the reflectors and the like may be properly chosen according to the design.

The present embodiment differs from the first and the second embodiment in that the receiving filter F4 includes the DMS filter R10. However, the present embodiment has a common feature with the first and the second embodiment in that the resonator closest to the antenna is a parallel resonator R11 (which is also referred to as the closest resonator R11) whose resonance frequency is lower than the transmission passband.

If, for example, the duplexer D3 has a transmission passband including a frequency range from 824 MHz to 849 MHz and a reception passband including a frequency range from 869 MHz to 894 MHz, it is preferable that the closest resonator R11 is configured to have the resonance frequency of about 810 MHz.

By providing the closest resonator R11 as discussed above, in the duplexer D3 as well, signal components close to the resonance frequency of the closest resonator R11 in the transmission signal, which is sent from the transmission terminal 20 and relayed to the transmitting filter F1, tend to flow to the ground via the closest resonator R11 in the same manner as in the duplexer D1 in the first embodiment. Thus, the duplexer D3 can improve attenuation characteristics in the lower vicinity of the transmission passband. That is, a deterioration in attenuation characteristics of the transmission signal at frequencies in the lower vicinity of the transmission passband, which might otherwise occur due to the presence of the inductor L2, can be suppressed by further providing the closest resonator R11 as in the first embodiment.

The duplexer D3 in the present embodiment can also be fabricated using the same method as that of the duplexer D1 in the first embodiment. Further, it can also be applied to the communications equipment in the same manner as in the first embodiment.

As described above, in accordance with the present embodiment as well, it is possible to provide a duplexer having high attenuation characteristics in a frequency range other than the passband (especially in a frequency range lower than the passband including the transmission frequency band) while satisfying the demands for reducing the size.

Further, the number of the electrode pairs in each IDT in the multimode filter, the crossing width, the number of the electrode pairs in each of the reflectors in the multimode filter, as well as the number of the multimode filters, can be properly determined according to the design. The receiving filter may also be configured by further installing an additional resonator, connected in series or parallel with respect to the signal line, in front or rear of the multimode filter.

IMPLEMENTATION EXAMPLES

Hereinafter, implementation examples in accordance with the embodiments of the present invention will be described. The following examples are presented for exemplary purposes only, and the present invention should not be construed to be limited thereto. In the examples, the duplexer is configured such that the transmission passband includes a frequency range (transmission frequency band) from 824 MHz to 849 MHz, and the reception passband includes a frequency range (receiving frequency band) from 869 MHz to 894 MHz.

Implementation Example 1

In the present example, the duplexer D1 of the first embodiment was fabricated.

First, a piezoelectric substrate formed of $LiTaO_3$ was prepared, and a Ti thin-film with a thickness of 6 nm was formed on a main surface of the substrate. Then, an Al—Cu thin film was formed thereon with a thickness of 125 nm. The Ti and Al—Cu films were laminated alternately three times each, thereby forming a Ti/Al—Cu laminated film having six thin layers in total.

Next, by using a resist coater, a photoresist was coated with a thickness of about 0.5 µm on the Ti/Al—Cu laminated film. Thereafter, photoresist patterns of resonators, signal lines, ground lines, pad electrodes and the like were formed by a reduction projection aligner (stepper) to form the circuit shown in FIG. 1. Then, by using a development apparatus, unnecessary portions of the photoresist were dissolved by an alkaline developing solution.

Subsequently, the unnecessary portions were removed by an etching process with a RIE (Reactive Ion Etching) apparatus while leaving necessary portions, so that circuit patterns that constitute the circuit configuration shown in FIG. 1A was formed. Table 1 shows manufacturing conditions for each of the resonators at that time. More exactly, the circuit patterns were formed by repeatedly arranging desired circuit patterns two-dimensionally on the piezoelectric substrate as a motherboard for multiple molding.

TABLE 1

| No. | Number of pairs (Pairs) | Crossing width (μm) | Resonance frequency (MHz) |
| --- | --- | --- | --- |
| T1 | 100 | 146 | 836 |
| T2 | 100 | 125 | 839 |
| T3 | 80 | 125 | 807 |
| T4 | 100 | 96 | 832 |
| T5 | 80 | 54 | 807 |
| T6 | 80 | 47 | 846 |
| T7 | 80 | 85 | 807 |
| T8 | 100 | 103 | 835 |
| R1 | 80 | 78 | 811 |
| R2 | 80 | 54 | 906 |
| R3 | 80 | 87 | 854 |
| R4 | 80 | 54 | 885 |
| R5 | 100 | 140 | 849 |
| R6 | 80 | 75 | 881 |
| R7 | 120 | 138 | 845 |
| R8 | 80 | 46 | 883 |
| R9 | 80 | 64 | 855 |

Then, a protective film was formed on a specified area of the circuit patterns. That is, a SiO$_2$ film was formed with a thickness of about 0.02 μl on the electrode patterns and the main surface of the piezoelectric substrate by using a CVD (Chemical Vapor Deposition) apparatus. Thereafter, the photoresist was patterned by photolithography, and the SiO$_2$ film of electrode parts (a pad electrode part of, e.g., an input and output electrode and a ground electrode, and an annular electrode part that encloses an entire portion thereof) for a flip chip was etched by the RIE apparatus or the like.

Subsequently, by using a sputtering apparatus, a film of a laminated electrode containing Cr, Ni and Au was formed on a portion where SiO$_2$ film had been removed. Here, a thickness of the electrode was set to be about 1 μm (0.01 μm of Cr, 1 μm of Ni, and 0.2 μm of Au). Further, the photoresist and the laminated electrode lying on undesired portions were simultaneously removed by lift-off method, and the electrode parts for a flip chip, to which a flip chip bump is to be connected, were formed at the portion where the laminated electrode had been formed.

Thereafter, the piezoelectric substrate was diced along dicing lines to thereby acquiring a plurality of chips, each of which has electrode patterns formed on the piezoelectric substrate S.

Subsequently, a circuit board, in which lines are formed corresponding to the inductors L1, L2 and L3, was prepared, and a conductive material was printed on a pattern electrode formed of silver, an input and output conductor, a ground conductor and an annular conductor. A solder was used as the conductive material. Then, by using a flip chip mounting apparatus, each chip was temporarily adhered to a ceramic circuit board corresponding thereto in a manner that an electrode-formed surface faced down. This temporary adhesion was performed under an N$_2$ atmosphere. Further, by performing a baking under the N$_2$ atmosphere to melt the solder, the chip was adhered to the ceramic circuit board. That is, the solder was melted on the annular electrode formed on the chip and the annular conductor formed on the circuit board and adhered thereto, whereby the electrode patterns on the chip surface were hermetically sealed.

Further, a resin was coated on the ceramic circuit board where the chip had been attached, and a baking thereof was performed in the N$_2$ atmosphere, thereby resin-sealing the chip.

Finally, the ceramic circuit board was diced along dicing lines to be divided into individual pieces, so that the duplexer D1 of the embodiment was obtained in a state installed on the circuit board. Further, each individual piece of the ceramic circuit board was as large as 2.5×2.0 mm$^2$ in area, and was formed of a laminated structure.

Then, attenuation characteristics of thus obtained duplexer D1 in the vicinity of the transmission passband were measured by a network analyzer.

Implementation Example 2

In the present example, the duplexer D1 of the first embodiment was fabricated and inspected in the same manner as in the example 1, except that manufacturing conditions for each resonator are different therefrom as listed in Table 2. Further, in the present example, the resonators are configured such that the number of the electrode pairs in each IDT in the closest resonator R1 multiplied by the crossing width thereof is set to be smaller than the number of the electrode pairs in each IDT in the parallel resonators R3, R5, R7 and R9 multiplied by the crossing width thereof.

TABLE 2

| No. | Number of pairs (Pairs) | Crossing width (μm) | Resonance frequency (MHz) |
| --- | --- | --- | --- |
| T1 | 100 | 146 | 836 |
| T2 | 100 | 125 | 839 |
| T3 | 80 | 125 | 807 |
| T4 | 100 | 96 | 832 |
| T5 | 80 | 54 | 807 |
| T6 | 80 | 47 | 846 |
| T7 | 80 | 85 | 807 |
| T8 | 100 | 103 | 835 |
| R1 | 80 | 12 | 809 |
| R2 | 80 | 54 | 906 |
| R3 | 80 | 87 | 854 |
| R4 | 80 | 54 | 885 |
| R5 | 100 | 140 | 849 |
| R6 | 80 | 75 | 881 |
| R7 | 120 | 138 | 845 |
| R8 | 80 | 46 | 883 |
| R9 | 80 | 64 | 855 |

Implementation Example 3

In the present example, the duplexer D2 of the second embodiment was fabricated and inspected in the same manner as in the example 1. Table 3 shows the manufacturing conditions for each resonator in this case. In this example, the resonance frequency of the closest resonator R1 is set to be smaller than that of the closest resonator T9 as shown in Table 3.

TABLE 3

| No. | Number of pairs (Pairs) | Crossing width (μm) | Resonance frequency (MHz) |
| --- | --- | --- | --- |
| T1 | 100 | 146 | 836 |
| T2 | 100 | 125 | 839 |
| T3 | 80 | 125 | 807 |
| T4 | 100 | 96 | 832 |
| T5 | 80 | 54 | 807 |
| T6 | 80 | 47 | 846 |
| T7 | 80 | 85 | 807 |
| T8 | 100 | 103 | 835 |
| T9 | 80 | 58 | 753 |
| R1 | 80 | 78 | 811 |
| R2 | 80 | 54 | 906 |
| R3 | 80 | 87 | 854 |
| R4 | 80 | 54 | 885 |
| R5 | 100 | 140 | 849 |
| R6 | 80 | 75 | 881 |
| R7 | 120 | 138 | 845 |
| R8 | 80 | 46 | 883 |
| R9 | 80 | 64 | 855 |

Implementation Example 4

In the present example, the duplexer D2 of the second embodiment was fabricated and inspected in the same manner as in the example 3, except that the manufacturing conditions for each resonator are different therefrom as listed in Table 4. Further, in the present example, the resonance frequency of the closest resonator R1 is set to be equal to that of the closest resonator T9 as shown in Table 4. Furthermore, in this example, the resonators are configured such that the number of the electrode pairs in each IDT in the closest resonator R1 multiplied by the crossing width thereof is smaller than the number of the electrode pairs in each IDT in the parallel resonators R3, R5, R7 and R9 multiplied by the crossing width thereof, and the number of the electrode pairs in the IDT in the closest resonator T9 multiplied by the crossing width thereof is smaller than the number of the electrode pairs in each IDT in the parallel resonators T3, T5 and T7 multiplied by the crossing width thereof.

TABLE 4

| No. | Number of pairs (Pairs) | Crossing width (μm) | Resonance frequency (MHz) |
| --- | --- | --- | --- |
| T1 | 100 | 146 | 836 |
| T2 | 100 | 125 | 839 |
| T3 | 80 | 125 | 807 |
| T4 | 100 | 96 | 832 |
| T5 | 80 | 54 | 807 |
| T6 | 80 | 47 | 846 |
| T7 | 80 | 85 | 807 |
| T8 | 100 | 103 | 835 |
| T9 | 80 | 12 | 809 |
| R1 | 80 | 12 | 809 |
| R2 | 80 | 54 | 906 |
| R3 | 80 | 87 | 854 |
| R4 | 80 | 54 | 885 |
| R5 | 100 | 140 | 849 |
| R6 | 80 | 75 | 881 |
| R7 | 120 | 138 | 845 |
| R8 | 80 | 46 | 883 |
| R9 | 80 | 64 | 855 |

Implementation Example 5

In the present example, the duplexer D3 of the third embodiment was fabricated and inspected in the same manner as in the example 1. Table 5 shows the manufacturing conditions for each resonator in this case.

TABLE 5

| No. | Number of pairs (Pairs) | Crossing width (μm) | Resonance frequency (MHz) |
| --- | --- | --- | --- |
| T1 | 100 | 146 | 836 |
| T2 | 100 | 125 | 839 |
| T3 | 80 | 125 | 807 |
| T4 | 100 | 96 | 832 |
| T5 | 80 | 54 | 807 |
| T6 | 80 | 47 | 846 |
| T7 | 80 | 85 | 807 |
| T8 | 100 | 103 | 835 |
| R11 | 50 | 52 | 813 |
| | | | Center frequency (MHz) |
| 1a | 15 | 193 | 881 |
| 1b | 18 | 193 | |
| 1c | 15 | 193 | |
| 1d | 15 | 171 | |
| 1e | 18 | 171 | |
| 1f | 15 | 171 | |

Comparative Example 1

In a comparative example 1, a duplexer having a filter configured same as that of the duplexer D1 in the implementation example 1, except that the closest resonator R1 was omitted in this comparative example, was fabricated and inspected in the same manner as in the implementation example 1.

Comparative Example 2

In a comparative example 2, a duplexer having a filter configured same as that of the duplexer D3 in the implementation example 5, except that the closest resonator R11 was omitted in this comparative example, was fabricated and inspected in the same manner as in the implementation example 5.

Comparison of Characteristics

Figure 9:
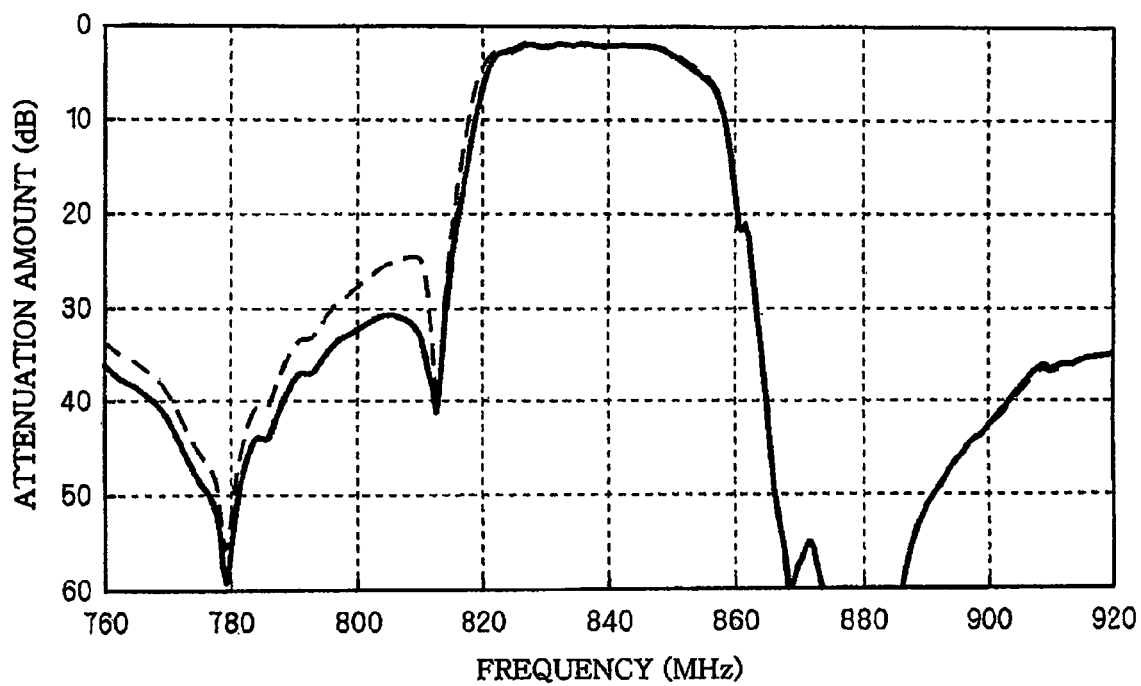
FIG. 9 shows attenuation characteristics in the vicinity of a transmission passband of duplexers in accordance with an implementation example 5 and a comparative example 2.

FIGS. 5 to 8 are graphs showing frequency characteristics (attenuation) of the duplexers in the implementation examples 1 to 4 in the vicinity of the passband (transmission passband) of the transmitting filter in comparison with those in the comparative example 1. Further, FIG. 9 is a graph showing frequency characteristics of the duplexer in the implementation example 5 in the vicinity of the transmission passband in comparison with those of the duplexer in the comparative example 2. However, FIGS. 5 to 8 do not show the passband of the receiving filter. In any one of FIGS. 5 to 8, the horizontal axis represents the frequency (unit: MHz) and the vertical axis represents the attenuation (unit: dB). Each of the characteristic curves indicated by a solid line shows the result relative to the duplexer in each of the implementation examples, whereas each of the characteristic curves indicated by a dashed line shows the result relative to the duplexer in each of the comparative examples.

Further, Table 6 shows the insertion losses and the attenuation at frequencies in the lower vicinity of the transmission passband in accordance with the implementation examples and the comparative examples.

TABLE 6

|  | Insertion loss in the transmission passband (dB) | Attenuation in the lower vicinity of the transmission passband (dB) |
| --- | --- | --- |
| Implementation example 1 | 3.8 | 38 |
| Implementation example 2 | 1.9 | 28 |
| Implementation example 3 | 3.3 | 37 |
| Implementation example 4 | 2.2 | 27 |
| Comparative example 1 | 2.0 | 24 |
| Implementation example 5 | 2.7 | 31 |
| Comparative example 2 | 2.5 | 25 |

According to the results listed in Table 6, the attenuation in the lower vicinity of the transmission passband in any one of the duplexers in the implementation examples 1 to 5, which has the closest resonator R9 or R11, is greater than those of the duplexers in the comparative examples 1 and 2 that do not include the closest resonators R9 and R11. The results apparently show that, by further providing the closest resonator, the attenuation characteristics can be enhanced in the lower vicinity of the transmission passband.

Further, comparing the results relative to the implementation examples 2 and 4 to those relative to the implementation examples 1 and 3 and the comparative example 1, it can be understood that the attenuations in the lower vicinity of the transmission passband in the implementation examples 2 and 4 are smaller than those in the implementation examples 1 and 3, but are greater than that of the comparative example 1. Further, the insertion losses in the examples 2 and 4 are approximately equal to that in the comparative example 1. That is, it has been confirmed in the implementation examples that, by setting the number of the electrode pairs in the closest resonator R9 multiplied by the crossing width thereof to be smaller than the number of the electrode pairs in the parallel resonator in the filter F2 multiplied by the crossing width thereof, the attenuation characteristics can be improved in the lower vicinity of the transmission passband while not increasing the insertion loss.

As discussed above, in accordance with the embodiments of the present invention, it is possible to provide a duplexer having high attenuation characteristics in a frequency range other than the passband (especially in a frequency range lower than the passband including the transmission frequency band) while satisfying the demands for reducing the size. To be specific, in the transmission signal, signal components close to the resonance frequency of the receive-side closest resonator tend to flow to the ground via the receive-side closest resonator. In this manner, the duplexer can improve its attenuation characteristics at frequencies in the lower vicinity of the transmission passband. Thus, it is possible to suppress a deterioration in attenuation characteristics of the transmission signal in the lower vicinity of the transmission passband, which might otherwise occur due to the presence of the first inductor or both of the first and the second inductor.

Further, in accordance with the embodiments of the present invention, the impedance increases in a frequency range other than the resonance frequency of the receive-side closest resonator. Thus, in the transmission signal, signal components within the frequency range other than the resonance frequency of the receive-side closest resonator is less likely to flow to the ground via the receive-side closest resonator. Therefore, it is possible to suppress a deterioration in the attenuation characteristics of the transmission signal in the lower vicinity of the transmission passband while hardly increasing the loss in the transmission passband.

Furthermore, in accordance with the embodiments of the present invention, signal components in the transmission signal close to the resonance frequency of the transmit-side closest resonator tend to flow to the ground via the transmit-side closest resonator. By combining this effect with that of the receive-side closest resonator together, the attenuation characteristics can be further improved.

Moreover, in accordance with the embodiment of the present invention, the communications equipment capable of suppressing signal leakage between the transmitter circuit and the receiver circuit can be realized without using a large-sized duplexer. That is, it is possible to provide a communications equipment that is compact and has a high communications quality.

While the invention has been shown and described with respect to the embodiments, it will be understood by those skilled in the art that various changes and modification may be made without departing from the scope of the invention as defined in the following claims.

What is claimed is:

1. A duplexer comprising:
a piezoelectric substrate;
a transmitting filter on the piezoelectric substrate, including a ladder filter having a first resonator group, the first resonator group comprising:
one or more resonators disposed in one or more series arms; and
one or more resonators disposed in one or more parallel arms;
a receiving filter on the piezoelectric substrate, having a passband higher than that of the transmitting filter, and including a second resonator group, the second resonator group comprising:
one or more resonators disposed in one or more series arms; and
one or more resonators disposed in one or more parallel arms;
a node connecting both a transmit-side end portion of the transmitting filter and a receive-side first portion of the receiving filter,
wherein the receive-side closest resonator which is in the second resonator group and is closest to the node in the parallel arm is closer to the node than a resonator which is in the second resonator group and is closest to the node in the series arm, and a resonance frequency of the receive-side closest resonator is lower than the passband of the transmitting filter.

2. The duplexer according to claim 1, wherein the node is further connected to an antenna.

3. The duplexer according to claim 2, wherein a first inductor is between a signal line for connecting the antenna thereto and a terminal of reference voltage.

4. The duplexer according to claim 3, further comprising:
a second inductor being between the resonators in the parallel arms of the transmitting filter and the terminal of the reference voltage.

5. The duplexer according to claim 4, wherein the resonators in the parallel arms of the transmitting filter are connected to the terminal of the reference voltage via the second inductor.

6. The duplexer according to claim 4, further comprising:
at least a third inductor being between the resonators in the parallel arms of the receiving filter and the terminal of the reference voltage.

7. The duplexer according to claim 6, wherein the resonators in the parallel arms of the receiving filter are between connected to the terminal of the reference voltage via the third inductor.

8. The duplexer according to claim 3, further comprising:
a transmitter circuit coupled to the transmitting filter; and
a receiver circuit coupled to the receiving filter,
wherein the first inductor has a substantially infinite impedance between the antenna and the transmitter circuit in a reception passband, and has a substantially infinite impedance between the transmitter circuit and the receiver circuit in a transmission passband.

9. The duplexer according to claim 1, wherein the receiving filter is a ladder filter including the second resonator group.

10. The duplexer according to claim 9, wherein the second resonator group comprises at least two resonators in the parallel arms of the receiving filter, the receive-side closest resonator has a capacitive component smaller than that of each of the other resonators in the parallel arms.

11. The duplexer according to claim 10, wherein said at least two resonators disposed in the parallel arms are surface acoustic wave resonators, each of which including an IDT, the IDT comprising:
a pair of comb-shaped electrodes; and
a plurality of electrode fingers, wherein a surface acoustic wave propagates perpendicular to a lengthwise direction of the electrode fingers,
wherein the number of the electrode pairs in the receive-side closest resonator multiplied by a crossing width of each of the comb-shaped electrodes therein is set to be smaller than the number of the electrode pairs in each of the other resonators multiplied by a crossing width of each of the comb-shaped electrodes therein.

12. The duplexer according to claim 9, wherein a transmit-side closest resonator, which is closest to the node in the first resonator group of the transmitting filter, is disposed in a parallel arm, and a resonance frequency of the transmit-side closest resonator is lower than the passband of the transmitting filter.

13. The duplexer according to claim 12, wherein the resonance frequency of the transmit-side closest resonator is different from that of the receive-side closest resonator.

14. The duplexer according to claim 12, wherein a transmission passband of the transmitting filter includes a frequency range from 824 MHz to 849 MHz, a reception passband includes a frequency range from 869 MHz to 894 MHz, and the resonance frequency of the transmit-side closest resonator is about 750 MHz.

15. The duplexer according to claim 1, wherein a transmission passband includes a frequency range from 824 MHz to 849 MHz, and a reception passband includes a frequency range from 869 MHz to 894 MHz.

16. The duplexer according to claim 15, wherein the resonance frequency of the receive-side closest resonator is about 810 MHz.

17. The duplexer according to claim 1, wherein the resonators in the series arms in the second resonator group are multimode resonators, each of which includes at least two IDTs, each IDT comprising:
a pair of comb-shaped electrodes; and
a plurality of electrode fingers, wherein a surface acoustic wave propagates perpendicular to a lengthwise direction of the electrode fingers.

18. The duplexer according to claim 1, wherein the receiving filter includes a resonator in a parallel arm located closer to the node, and a DMS filter disposed in a series arm at a rear stage of the resonator.

19. A communications equipment comprising:
the duplexer according to claim 1;
the node connected to a signal line in the duplexer; and
a transmission and reception unit for transmitting a transmission signal to the transmitting filter in the duplexer and receiving a reception signal from the receiving filter in the duplexer.

20. A duplexer comprising:
a piezoelectric substrate;
a transmitting filter on the piezoelectric substrate, including a first ladder filter having a first resonator group which has a plurality of resonators disposed in a plurality of series arms and a plurality of resonators disposed in a plurality of parallel arms;
a receiving filter on the piezoelectric substrate, having a passband higher than that of the transmitting filter, and including a second ladder filter having a second resonator group which has a plurality of resonators disposed in a plurality of series arms and a plurality of resonators disposed in a plurality of parallel arms;
a node connecting both a transmit-side end portion of the transmitting filter and a receive-side first portion of the receiving filter,
wherein the receive-side closest resonator which is in the second resonator group and is closest to the node in the parallel arm is closer to the node than a resonator which is in the second resonator group and is closest to the node in the series arm, and a resonance frequency of the receive-side closest resonator is lower than the passband of the transmitting filter.

* * * * *